(12) United States Patent
Ogiwara et al.

(10) Patent No.: US 7,724,581 B2
(45) Date of Patent: May 25, 2010

(54) DISCHARGE ORDER CONTROL CIRCUIT AND MEMORY DEVICE

(75) Inventors: Ryu Ogiwara, Kanagawa (JP); Shinichiro Shiratake, Kanagawa (JP); Daisaburo Takashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 758 days.

(21) Appl. No.: 11/671,107

(22) Filed: Feb. 5, 2007

(65) Prior Publication Data
US 2007/0274132 A1 Nov. 29, 2007

(30) Foreign Application Priority Data
May 29, 2006 (JP) ............................. 2006-148826

(51) Int. Cl.
*G11C 16/06* (2006.01)
*G05F 3/02* (2006.01)
(52) U.S. Cl. .................................. 365/185.23; 327/543
(58) Field of Classification Search .................. 315/160, 315/102, 199; 365/185.23, 185.25, 185.08, 365/76, 191, 194, 189.011, 189.03, 189.14, 365/189.17, 189.2; 327/392, 393, 394, 344, 327/106, 538, 543
See application file for complete search history.

(56) References Cited

U.S. PATENT DOCUMENTS 6,999,367 B2 * 2/2006 Yamagami ............... 365/210.1
7,002,856 B2 * 2/2006 Watanabe et al. ........... 365/191
7,006,385 B2 * 2/2006 Miyazaki ................ 365/185.29
2005/0190604 A1 * 9/2005 Nagatomo ............. 365/185.23
2006/0039219 A1 * 2/2006 Sofer et al. ................. 365/222

FOREIGN PATENT DOCUMENTS

JP 2003-196974 7/2003

OTHER PUBLICATIONS

D. Takashima, et al., "High-Density Chain Ferroelectric Random-Access Memory (CFRAM)", 1997 Symposium on VLSI Circuits Digest of Technical Papers, 1997, p. 83 and 84.
Daisaburo Takashima, et al., "A Sub-40ns Random-Access Chain FRAM Architecture with a 7ns Cell-Plate-Line Drive", IEEE International Solid-State Circuits Conference, ISSCC99 / Session 6 / Paper MP 6.1, Feb. 15, 1999, p. 102 and 103.

* cited by examiner

*Primary Examiner*—Douglas W Owens
*Assistant Examiner*—Minh D A
(74) *Attorney, Agent, or Firm*—Oblon, Spivak, McClelland, Maier & Neustadt, L.L.P.

(57) ABSTRACT

A discharge order control circuit includes a pool circuit a delay circuit and a discharge unit to control a discharge order of internal power supplies. The pool circuit stores electric charges provided from a potential of an external power supply. The delay circuit operates on the electric charges stored in the pool circuit and delays a discharge signal generated when potential of the external power supply is lowered to a predetermined potential level. The delay circuit includes an inverter array having a plurality of stages each containing an inverter. The plurality of stages include a final stage that outputs the delayed discharge signal. Only the inverter of the final stage generates an RC delay.

19 Claims, 11 Drawing Sheets

DISCHARGE ORDER CONTROL CIRCUIT AND MEMORY DEVICE

CROSS-REFERENCE TO RELATED APPLICATIONS

This application is based upon and claims the benefit of priority from Japanese Patent Application No. 2006-148826, filed on May 29, 2006, the entire contents of which are incorporated herein by reference.

BACKGROUND

1. Field

The present invention relates to a semiconductor device, and more particularly to a discharging order control circuit for use in a destructive-read and nonvolatile memory such as a ferroelectric memory.

2. Description of the Related Art

As a kind of nonvolatile semiconductor memories, there is known a ferroelectric memory (FeRAM) (for example, see JP-A 2003-196974 (KOKAI)). The FeRAM has an advantage of reading/writing operations at higher speeds over a flash memory. However, the FeRAM may have the following disadvantage. The FeRAM has a destructive reading operation in which an electric field of a direction from a plate line to a bit line is applied to between the both electrodes of a ferroelectric capacitor in a memory cell to thereby read data. According to this operation, a malfunction may occur in the core circuits of the memory cell during the reading operation, or a wrong data writing operation may occur in the memory cell due to the sudden lowering of a power supply voltage. Therefore, in the FeRAM, it is necessary to prevent the occurrence of the malfunction in the core circuits and thus prevent the writing of wrong data.

The possibility of the wrong data writing occurring is highest in the time when the inner power supply voltage of a chip is not stable, that is, the time when the FeRAM is turned on and the time when it is turned off. In view of this, in the time when turning on the FeRAM, various internal power supplies are sequentially turned on in good order. In this case, it is most important that the internal power supply to be supplied to an array part of the FeRAM should be activated after the internal power supplies to be supplied to peripheral circuits are supplied and the peripheral circuits are held in their normal operating conditions. On the other hand, when turning off the FeRAM, the respective internal power supplies are forcedly discharged sequentially. In this case, it is most important that, after the voltage to be supplied to the array part is deactivated to thereby eliminate the possibility of the malfunction occurring in cell array, the internal power supply voltages to be supplied to the peripheral circuits should be deactivated.

SUMMARY

According to a first aspect of the invention, there is provided a discharge order control circuit for controlling a discharge order of a plurality of internal power supplies each of which power is generated based on power supplied from an external power supply, the discharge order control circuit includes: a pool circuit that stores electric charges provided from a potential of the external power supply; a first delay circuit that operates on the electric charges stored in the pool circuit and delays a discharge signal generated when potential of the external power supply is lowered to a predetermined potential level, the first delay circuit including a first inverter array having a plurality of stages each containing an inverter, the plurality of stages including a final stage that outputs the delayed discharge signal, and only the inverter of the final stage which generates an RC delay; and a first discharge unit that discharges a first internal power supply included in the plurality of internal power supplies in response to the delayed discharge signal output from the inverter of the final stage of the first inverter array.

According to a second aspect of the invention, a discharge order control circuit for use in a memory device including a memory cell and for controlling the discharge order of a plurality of internal power supplies each of which power is generated based on power supplied from an external power supply, the discharge order control circuit includes: a first delay circuit that operates on the electric charges stored in a word line disposed in the memory cell and delays a discharge signal generated when the external power supply potential is lowered to a predetermined potential level, the first delay circuit including a first inverter array having a plurality of stages each containing an inverter, the plurality of stages including a final stage that outputs the delayed discharge signal, and only the inverter of the final stage which generates an RC delay; and a first discharge unit that discharges a first internal power supply included in the plurality of internal power supplies in response to the delayed discharge signal output from the inverter of the final stage of the first inverter array According to a third aspect of the invention, there is provided a memory device including: a power supply potential detection circuit that monitors potential of an external power supply and generates a discharge signal when potential of the external power supply is lowered to a predetermined potential level; a memory cell array; a first internal power supply that supplies power to the memory cell array; a second internal power supply that supplies power to a peripheral circuit that controls an operation of the memory cell array; and a discharge order control circuit that controls a discharge order of the first internal power supply and the second internal power supply, wherein the discharge order control circuit includes: a pool circuit that stores electric charges provided from a potential of the external power supply; a first delay circuit that operates on the electric charges stored in the pool circuit and delays the discharge signal output from the power supply potential detection circuit, the first delay circuit including a first inverter array having a plurality of stages each containing an inverter, the plurality of stages including a final stage that outputs the delayed discharge signal, and only the inverter of the final stage which generates an RC delay; and a first discharge unit that discharges the first internal power supply in response to the delayed discharge signal output from the inverter of the final stage of the first inverter array.

DETAILED DESCRIPTION

A discharge order control circuit according to an embodiment of the invention will be described with reference to the accompanying drawings. Among the drawings, the same or similar reference characters are assigned to the same or similar portions. The drawings are just typical views and thus it should be noted that the relationships between the thicknesses and plane dimensions of the parts, the ratios of the thicknesses between the respective layers and the like are different from the actual ones. Therefore, the specific thicknesses and dimensions should be judged with the following description taken into account. Also, it goes without saying that, among the drawings, there are included parts which are different from each other in the mutual dimensions and relationships.

Figure 1:
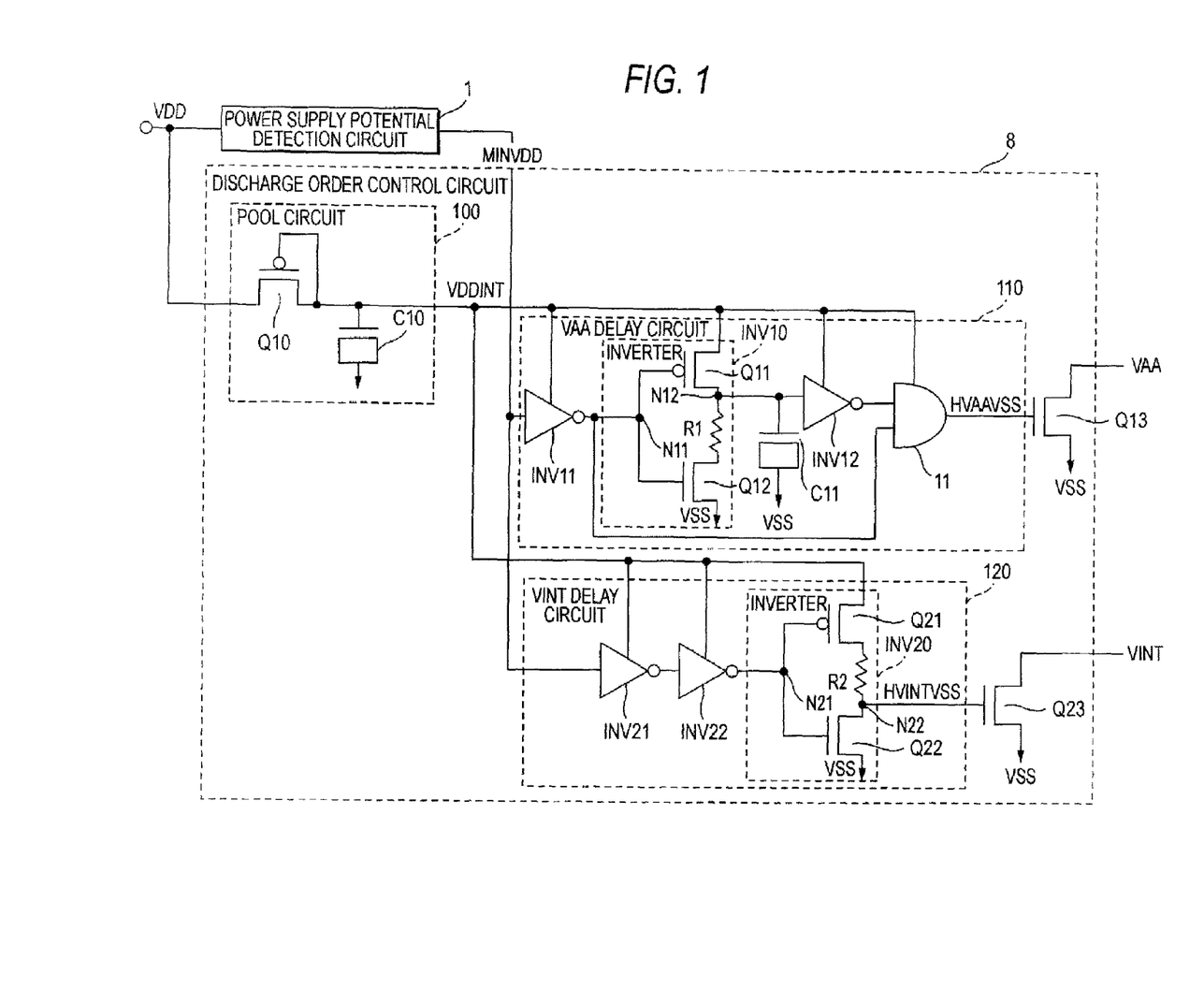
FIG. 1 is a circuit diagram of an example of a discharge order control circuit according to an embodiment of the invention.

As shown in FIG. 1, a discharge order control circuit 8 according to an embodiment of the invention is a circuit that controls the discharge order of a plurality of internal power supplies VAA, VINT to be generated by an external power supply VDD. The discharge order control circuit 8 includes: a pool circuit 100, a VAA delay circuit 110 that serves as an example of a second delay circuit, a VINT delay circuit 120 that serves as an example of a first delay circuit, a discharge transistor Q13 that serves as an example of a second discharge transistor, and a discharge transistor Q14 that serves as an example of a first discharge transistor. The pool circuit 100 stores electric charges at a potential VDDINT generated by lowering the potential of the external power supply VDD by a given voltage. The VINT delay circuit 120 delays a discharge signal to be generated by using the electric charges stored in the pool circuit 100 when the external power supply VDD is deactivated, and includes an inverter array containing a plurality of inverters INV21, INV22, INV20 with only the final-stage inverter INV20 capable of generating an RC delay. The discharge transistor Q23 includes a gate connected directly to the output node N22 of the final-stage inverter INV20 of the VINT delay circuit 120, a drain connected to the internal power supply VINT of the internal power supplies VAA, VINT, and a source connected to a ground potential VSS. The VAA delay circuit 110 delays a discharge signal by a time shorter than the VINT delay circuit 120 by the electric charges stored in the pool circuit 100, and includes an inverter array containing a plurality of inverters INV 11, INV 10, INV 12 with only the middle-stage inverter INV 10 capable of generating an RC delay. The second discharge transistor Q 13 includes an gate connected to the VAA delay circuit 110, a drain connected to the internal power supply VAA of the internal power supplies VAA, VINT different from the above-mentioned internal power supply VINT.

Figure 2:
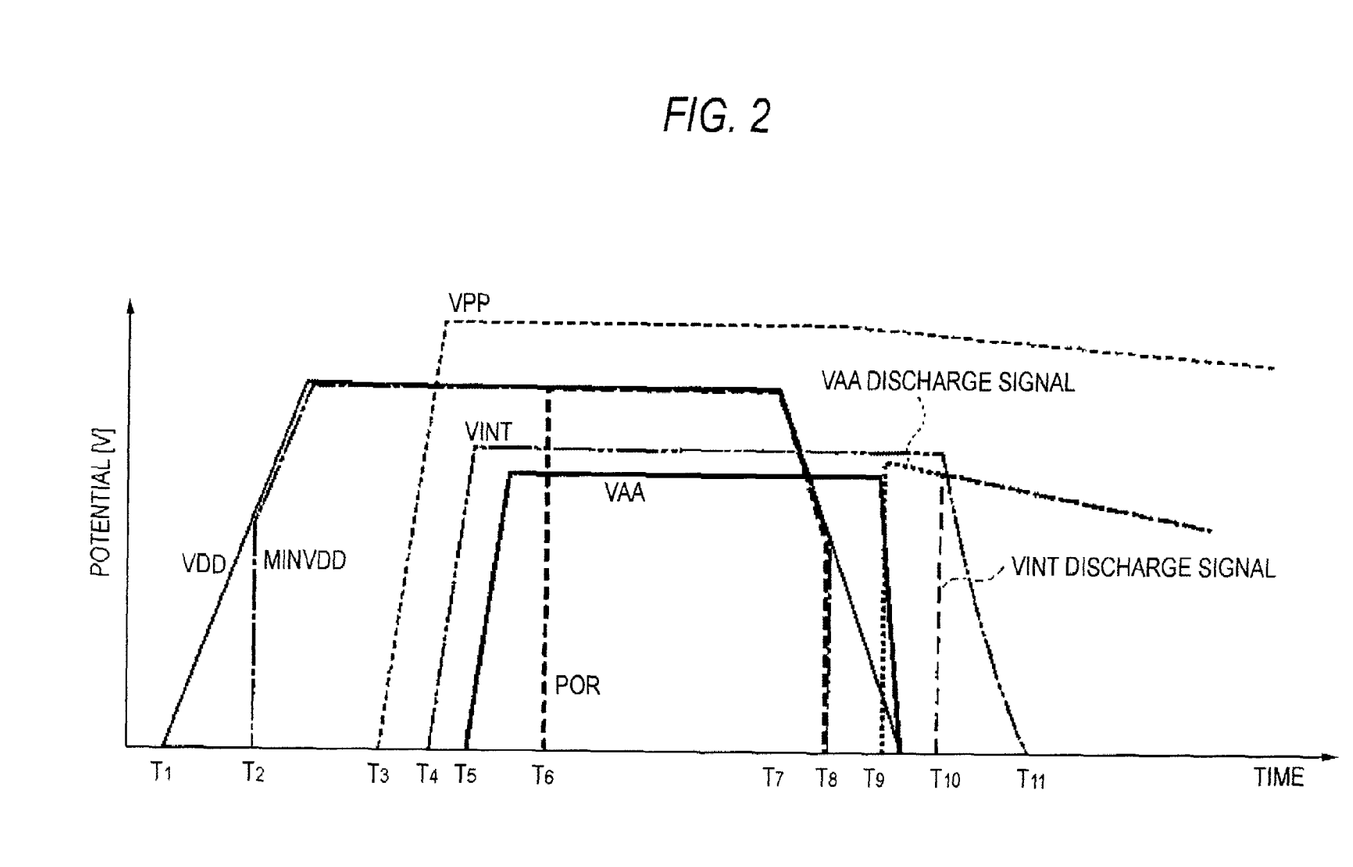
FIG. 2 is a timing chart to explain a method for controlling the start order and discharge order of a ferroelectric memory (FeRAM) according to the embodiment of the invention.

The discharge order control circuit 8 delays a power supply potential detection signal MINVDD from a power supply potential detection circuit 1 to thereby control the discharge order in such a manner that, as shown in FIG. 2, the internal power supplies VAA and VINT are allowed to discharge in this order. In FIG. 2, it should be noted that, while the internal power supplies VAA and VINT are forced to discharge, an internal power supply VPP is allowed to discharge naturally. Each of the internal power supplies VINT and VAA is generated by using a voltage lowering transistor of a source follower type. In case that the external power supply VDD is turned off and then the external power supply VDD is turned on again, if the potential of the gate of the voltage lowering transistor is near to the ground potential VSS and the internal power supply VINT or VAA is not discharged sufficiently, the internal power supplies VINT and VAA may overshoot due to a coupling with the gate of the voltage lowering transistor when the external power supply VDD is turned on again. On the other hand, since the voltage of the internal power supply VPP is boosted by a charge pump circuit, there does not arise such fear. Therefore, while the internal power supplies VINT and VAA are forced to discharge when the device to which the discharge order control circuit 8 is applied is turned on, the internal power supply VPP is allowed to discharge naturally.

Figure 3:
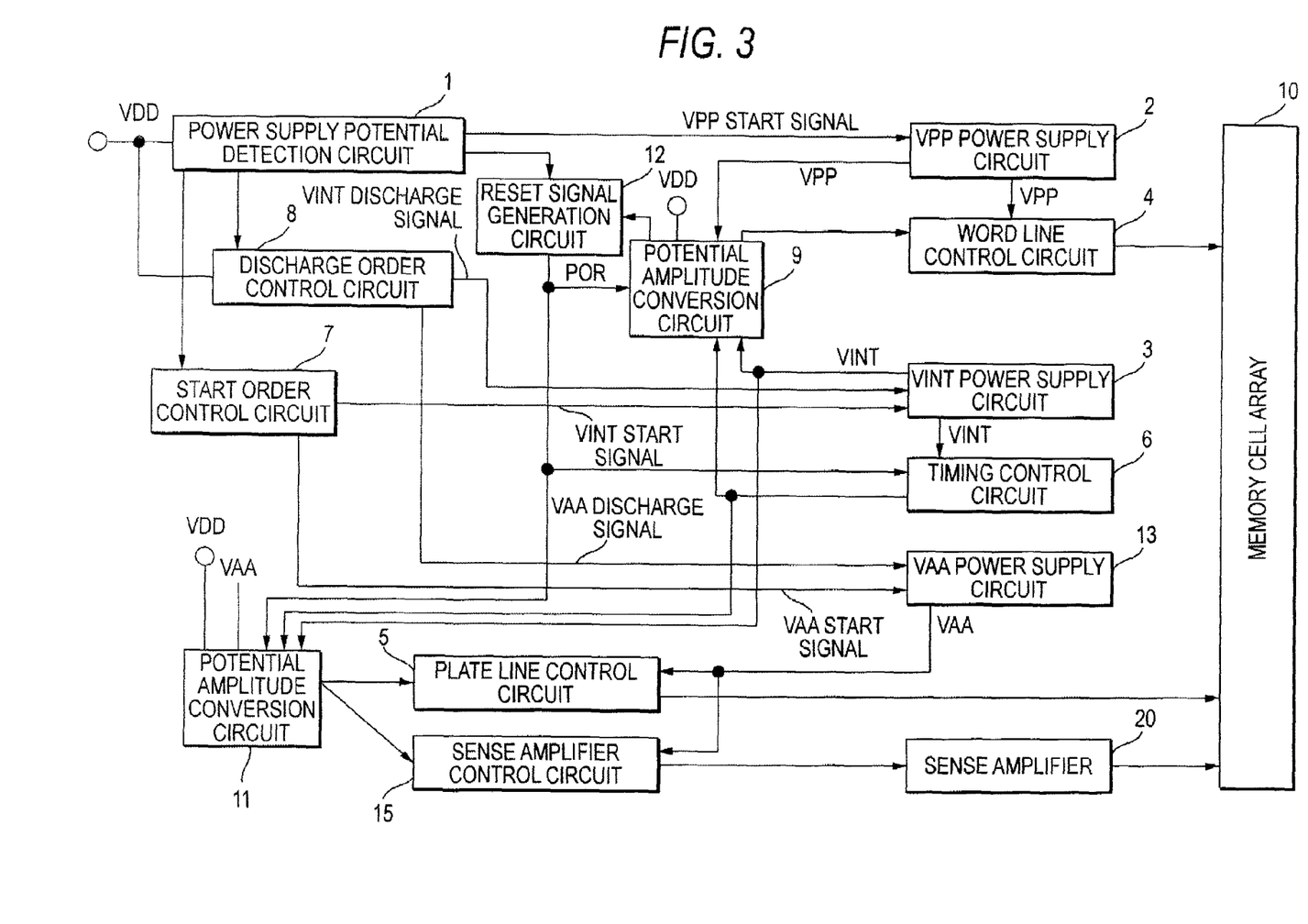
FIG. 3 is a block diagram of an example of a ferroelectric memory (FeRAM) according to the embodiment of the invention.

The discharge order control circuit 8 shown in FIG. 1 is applied to, for example, such a FeRAM as shown in FIG. 3. The FeRAM includes a memory cell array 10, a sense amplifier 20, a VPP power supply circuit (internal power supply circuit) 2, a VINT power supply circuit (internal power supply circuit) 13, a power supply potential detection circuit 1, a discharge order control circuit 8, a word line control circuit 4, a plate line control circuit 5, a timing control circuit 6, a start order control circuit 7, potential amplitude conversion circuits (LS-R) 9, 11, a reset signal generation circuit 12, and a sense amplifier control circuit 15.

The power supply potential detection circuit 1 detects the activation of the external power supply VDD when the FeRAM is turned on, and outputs a VPP start signal, a VINT start signal and a reset control signal. The VPP start signal is supplied to the VPP power supply circuit 2. The VINT start signal is supplied through the start order control circuit 7 to the VINT power supply circuit 3. The reset control signal is transmitted to the reset signal generation circuit 12.

Also, the power supply potential detection circuit 1 detects the deactivation of the external power supply VDD when the FeRAM is turned off, and outputs a signal to stop the operation of the VPP power supply circuit 2, a VINT discharge signal, a VAA discharge signal and a reset control signal. The signal to stop the operation of the VPP power supply circuit 2 is supplied to the VPP power supply circuit 2. The reset control signal is transmitted to the reset signal generation circuit 12. The VINT discharge signal is supplied through the discharge order control circuit 8 to the VINT power supply circuit 3. The VAA discharge signal is supplied through the discharge order control circuit 8 to the VAA power supply circuit 13.

Figure 4:
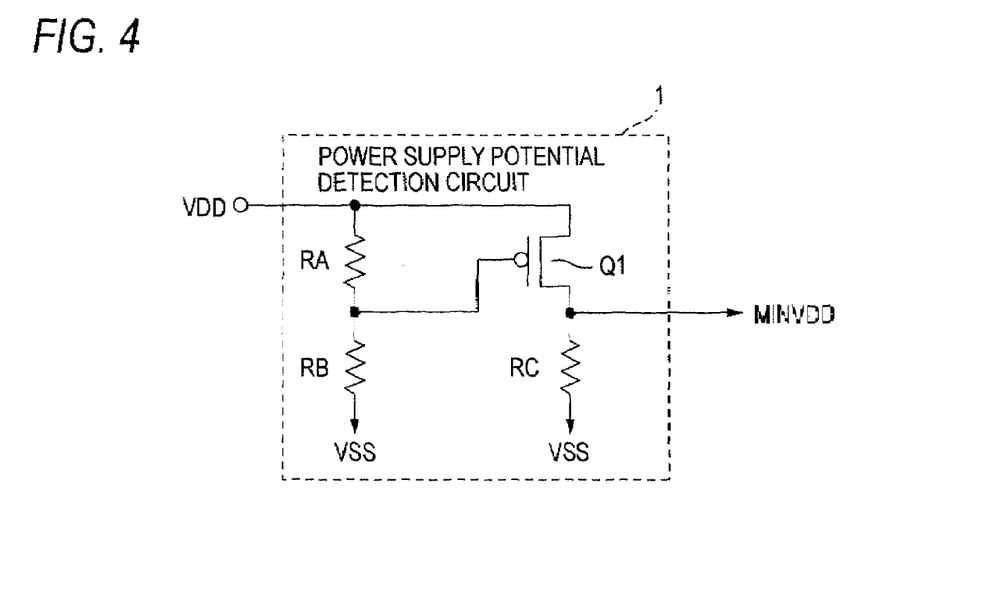
FIG. 4 is a circuit diagram of an example of a power supply potential detection circuit according to the embodiment of the invention.

As shown in FIG. 4, the power supply potential detection circuit 1 includes a resistor RA having one end connected to an external power supply VDD or the like, a resistor RB having one end connected to the other end of the resistor RA and the other end connected to the ground potential VSS, a pMOS transistor Q1 having a source connected to the external power supply VDD and a gate connected between the resistors RA and RB, and a resistor RC having one end connected to the drain of the pMOS transistor Q1 and the other end connected to the ground potential VSS.

In the power supply potential detection circuit 1, a potential provided by resistance-dividing the external power supply VDD at the resistor RA is input to the gate of the pMOS transistor Q1 in order to monitor the absolute value of a difference between the potential input to the gate and the external power supply VDD input directly to the source. When the monitored absolute value exceeds the absolute value of the threshold value of the pMOS transistor Q1, the power supply potential detection circuit 1 judges that the potential is higher than a given value, and when the monitored absolute value goes below the absolute value of the threshold value, the power supply potential detection circuit 1 judges that the potential is lower than the given value. When the potential exceeds the given value, the pMOS transistor Q1 turns on and a power supply potential detection signal MINVDD rises up from a "Low" level to a "High" level; on the other hand, when the potential is lower than the given value, the power supply potential detection signal MINVDD lowers down from the "High" level to the "Low" level. The power supply potential detection signal MINVDD activates the reset control signal, VPP start signal, VINT start signal, the signal to stop the operation of the VPP power supply circuit 2, VINT discharge signal, and VAA discharge signal.

The pool circuit 100 of the discharge order control circuit 8 shown in FIG. 1 includes a pMOS transistor Q10 and a capacitor C10 which are connected together through a diode. An electric charge, which has a potential VDDINT obtained by reducing the potential of the external power supply VDD down to the threshold value by the pMOS transistor Q10, is stored in the capacitor C10 and, using the thus stored electric charge, the VAA delay circuit 110 and VINT delay circuit 120 are put into operation.

If the external power supply VDD is used as the power supply potential of the VAA delay circuit 110 and VINT delay circuit 120, the VAA delay circuit 110 and VINT delay circuit 120 cannot be operated when the potential of the external power supply VDD suddenly lowers down. However, by using the pool circuit 100, even when the external power supply VDD suddenly lowers down in potential, the VAA delay circuit 110 and VINT delay circuit 120 can be operated.

Figure 5:
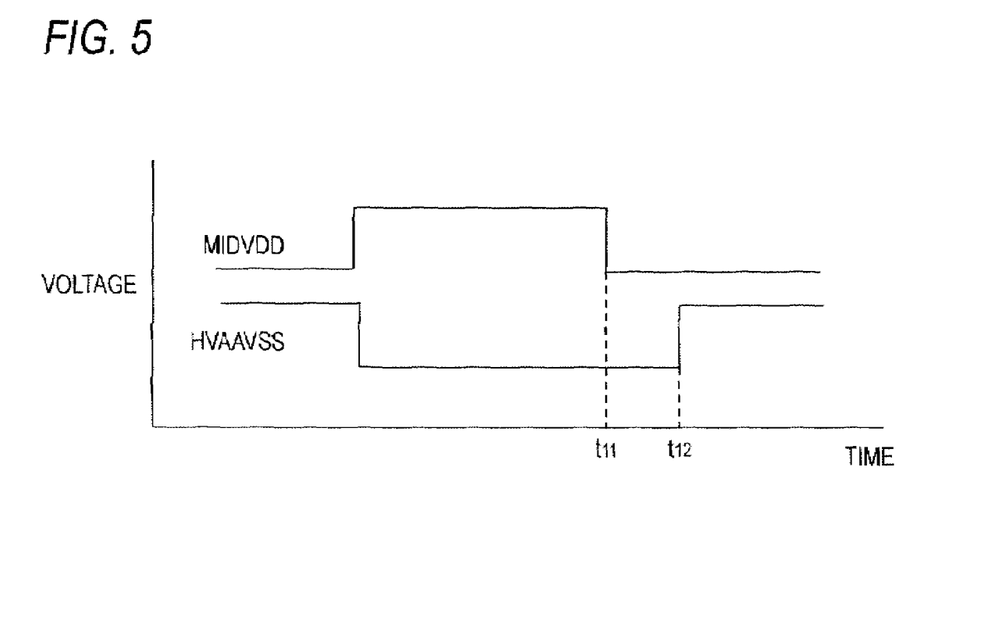
FIG. 5 is a timing chart of a delay time provided by a VAA delay circuit according to the embodiment of the invention.

The VAA delay circuit 110 includes: an inverter array containing inverters INV11, INV10 and INV12 which are respectively arranged in first, middle and final stages and can be operated by using the electric charges stored in the pool circuit 100; a capacitor C11 connected between the inverters INV10 and INV12; and an AND gate 11. The middle-stage inverter INV10 includes: a pMOS transistor Q11 and an nMOS transistor Q12 respectively having gates connected to an input node N11; and a resistor R1 connected between the respective drains of the pMOS transistor Q11 and nMOS transistor Q12. A node for connecting the resistor R1 and the drain of the nMOS transistor Q12 is used as the output node N12 of the inverter INV10. As shown in FIG. 5, the VAA delay circuit 110 is able to provide a delay time corresponding to the difference defined by t12−t11.

With regard to the discharge transistor Q13 shown in FIG. 1, the drain thereof is connected to the internal power supply VAA, the source thereof is connected to the ground potential VSS, and the gate thereof is connected directly to the VAA delay circuit 110. When a signal HVAAVSS input to the gate of the discharge transistor Q13 is at a "High" level, the discharge transistor Q13 is turned on to thereby discharge the internal power supply VAA to the ground potential VSS.

The VINT delay circuit 120 includes an inverter array containing inverters INV21, INV22 and INV 20 which are respectively arranged in first, middle and final stages and can be operated by using the electric charges stored in the pool circuit 100. Similarly to the middle-stage inverter INV10 of the VAA delay circuit 110, the final-stage inverter INV20 includes: a pMOS transistor Q21 and an nMOS transistor Q22 respectively having gates connected to the input node N21; and a resistor R2 connected between the respective drains of the pMOS transistor Q21 and nMOS transistor Q22. A node for connecting between the resistor R2 and the drain of the nMOS transistor Q22 is used as the output node N22 of the inverter INV20. However, the resistor R2 of the inverter INV 20 has larger resistance value than the resistor R1 of the inverter INV 10. Since the resistance value of the resistor R2 is larger than that of the resistor R1, the VINT delay circuit 120 is able to generate a longer delay time than the VAA delay circuit 110.

As regards the discharge transistor Q23, the drain thereof is connected to the internal power supply VINT, the source thereof is connected to the ground potential VSS, and the gate thereof is connected directly to the output node of the final-stage inverter INV20 that includes the output node N22. When a signal HVINTVSS input to the gate of the discharge transistor Q23 is at a "High" level, the discharge transistor Q23 is turned on to discharge the internal power supply VINT to the ground potential VSS, and the discharge of the internal power supply VINT starts after the beginning of the discharge of the internal power supply VAA.

Figure 6:
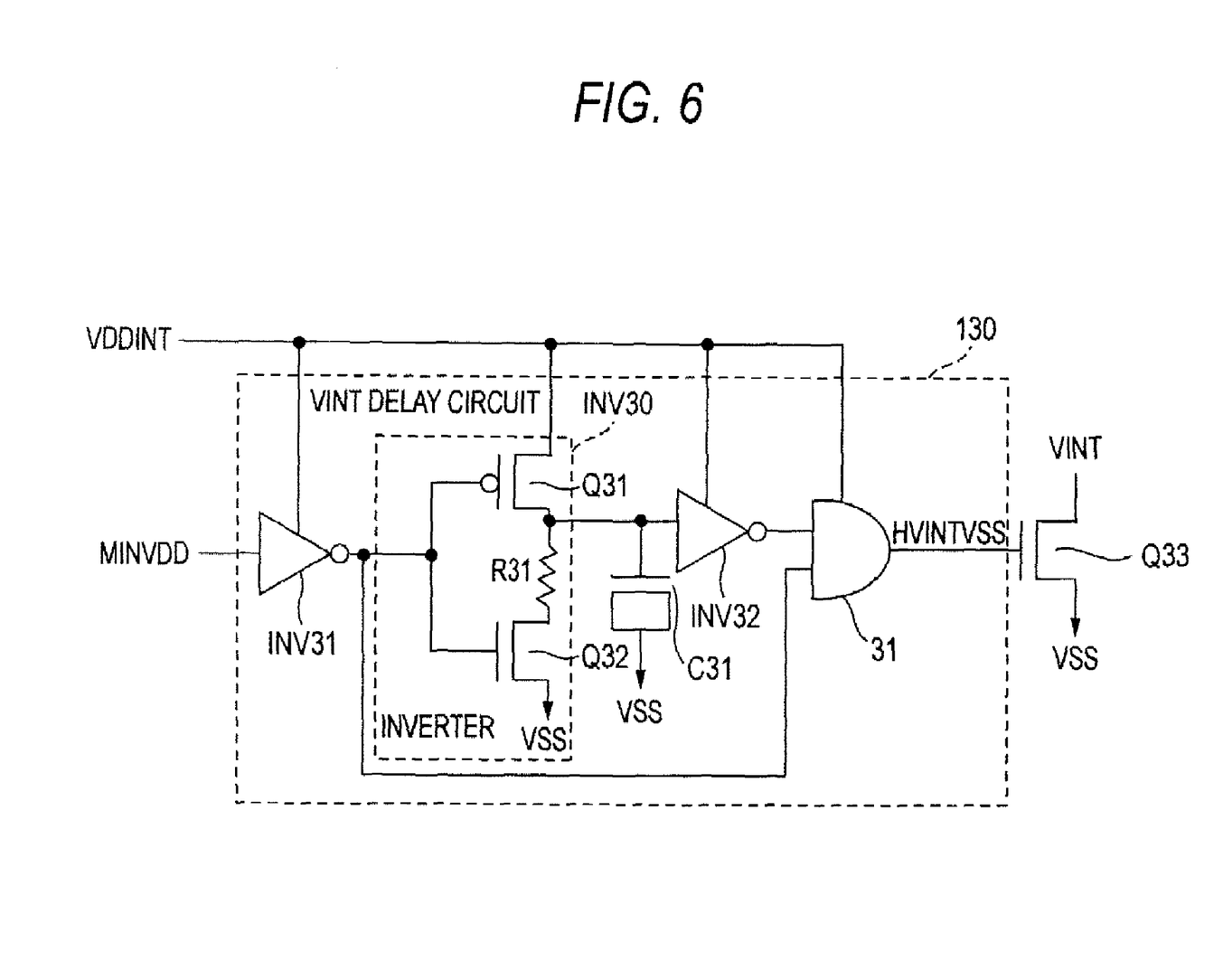
FIG. 6 is a circuit diagram of a VINT delay circuit according to a comparison example.

FIG. 6 shows a VINT delay circuit 130 according to a comparison example. The VINT delay circuit 130 includes an inverter array containing an inverter INV31, an inverter INV30, and an inverter INV32 respectively arranged in first, middle and final stages, a capacitor C31 connected between the middle-stage inverter INV30 and final-stage INV32, and an AND gate 31. When the FeRAM is turned on, an obtuse waveform is input from the middle-stage inverter INV30 to the gate of the inverter INV32, which induces a shoot-through current in the inverter INV32 so that the electric charges stored in the pool circuit 100 are consumed. When a current is consumed much in the VINT delay circuit 130, the electric charges stored is reduced, which may cause a malfunction to occur in the VINT delay circuit 130.

A simple method for avoiding such malfunction of the VINT delay circuit is to increase the size of the capacitor C31 which stores the electric charges therein. However, in order to reduce the area penalty in the dimension of the chip, the dimension of the capacitor cannot be increased.

On the other hand, according to the VINT delay circuit 120 shown in FIG. 1, the inverter INV20 to generate an RC delay is arranged in the final stage of the inverter array containing the inverters INV21, INV22 and INV20, while the output node N22 is directly connected to the gate of the discharge transistor Q23. Since there is no circuit that consumes the electric charges at a later stage of the final-stage inverter INV20, there is no shoot-through of electric charges having the potential VDDINT, which makes it possible to restrict the consumption of the electric charges stored in the pool circuit 100. Accordingly, when the external power supply VDD is turned off, it is possible to prevent the occurrence of a malfunction which is caused by an exhaustion of the electric charges stored, so that a sufficient delay time can be secured by the resistor R2 having a large resistance value. Also, since the signal HVINTVSS output from the VINT delay circuit 120 acts only to forcibly discharge the internal power supply VINT in the final stage, the waveform is allowed to be obtuse.

Also, in the VAA delay circuit 110, although a waveform between the output node N12 of the middle-stage inverter INV10 and the final-stage inverter INV12 becomes obtuse, because the delay time in the VAA delay circuit 110 is short when compared with the VINT delay circuit 120, the obtuseness of the waveform is small and the shoot-through current of the electric charge having the potential VDDINT can be neglected.

The start order control circuit 7 shown in FIG. 3 delays start signals such as a VAA start signal and a VINT start signal from the power supply potential detection circuit 1 respectively to thereby control the start order of the internal power supplies VPP, VAA, VINT, etc. when the memory is turned on, in the order of the internal power supplies VPP, VINT and VAA as shown in FIG. 2.

The reset signal generation circuit 12 shown in FIG. 3, on receiving a rest control signal from the power supply potential detection circuit 1, outputs a reset signal POR that resets and deactivate the core circuits and peripheral circuits. The reset signal POR is supplied to the word line control circuit 4 through the potential amplitude conversion circuit 9, the timing control circuit 6, and plate line control circuit 5 and the sense amplifier control circuit 15 through the potential amplitude conversion circuit 11.

The VPP power supply circuit 2 generates an internal power supply (a boosting potential) in response to receiving the VPP start signal output from the power supply potential detection circuit 1. The internal power supply VPP is supplied to, for example, the word lines of the memory cell array 10 and the word line control circuit 4 for controlling the word lines.

The VINT power supply circuit 3 generates an internal power supply (a peripheral circuit power supply potential) VINT that is different from both of the internal power supplies VPP and VAA, in response to the VINT start signal output form the start order control circuit 7. The internal power supply VINT is supplied to the plate lines and bit lines of the memory cell array 10 as well as to peripheral circuits such as the reset signal generation circuit 12 and timing control circuit 6.

The VAA power supply circuit 13 generates the internal power supply (the core circuit power supply potential) VAA in response to the VAA start signal output from the start order control circuit 7. The internal power supply VAA is supplied to the core circuits such as the plate line control circuit 5 and sense amplifier control circuit 15.

The timing control circuit 6 uses the internal power supply VINT to output a WL activation signal, a PL activation signal and the like. The WL activation signal is supplied to the word line control circuit 4, and the PL activation signal is supplied to the plate line control circuit 5 and the sense amplifier control circuit 15.

The word line control circuit 4 can be activated according to, for example, the WL activation signal to control the potential of the word lines. The WL activation signal is passed through the potential amplitude conversion circuit (LS-R) 9 before it is supplied to the word line control circuit 4. Since the timing control circuit 6 operates with the internal power supply VINT as its power supply and the word line control circuit 4 operates with the internal power supply VPP as its power supply, the potential amplitude conversion circuit (LS-R) 9 converts the potential amplitude of the WL activation signal to the potential amplitude of the internal power supply VPP.

The plate line control circuit 5 and the sense amplifier control circuit 15 can be activated according to, for example, the PL activation signal to control the potential of the plate lines and the potential of the sense amplifier 20 respectively. The PL activation signal is passed through the potential amplitude conversion circuit (LS-R) 11 before it is supplied to the plate line control circuit 5 and sense amplifier control circuit 15. Because the timing control circuit 6 operates with the internal power supply VINT as its power supply as well as the plate line control circuit 5 and sense amplifier control circuit 15 operate with the internal power supply VAA as their power supply, the potential amplitude conversion circuit (LS-R) 11 converts the potential amplitude of the PL activation signal to the potential amplitude of the internal power supply VAA.

Figure 7:
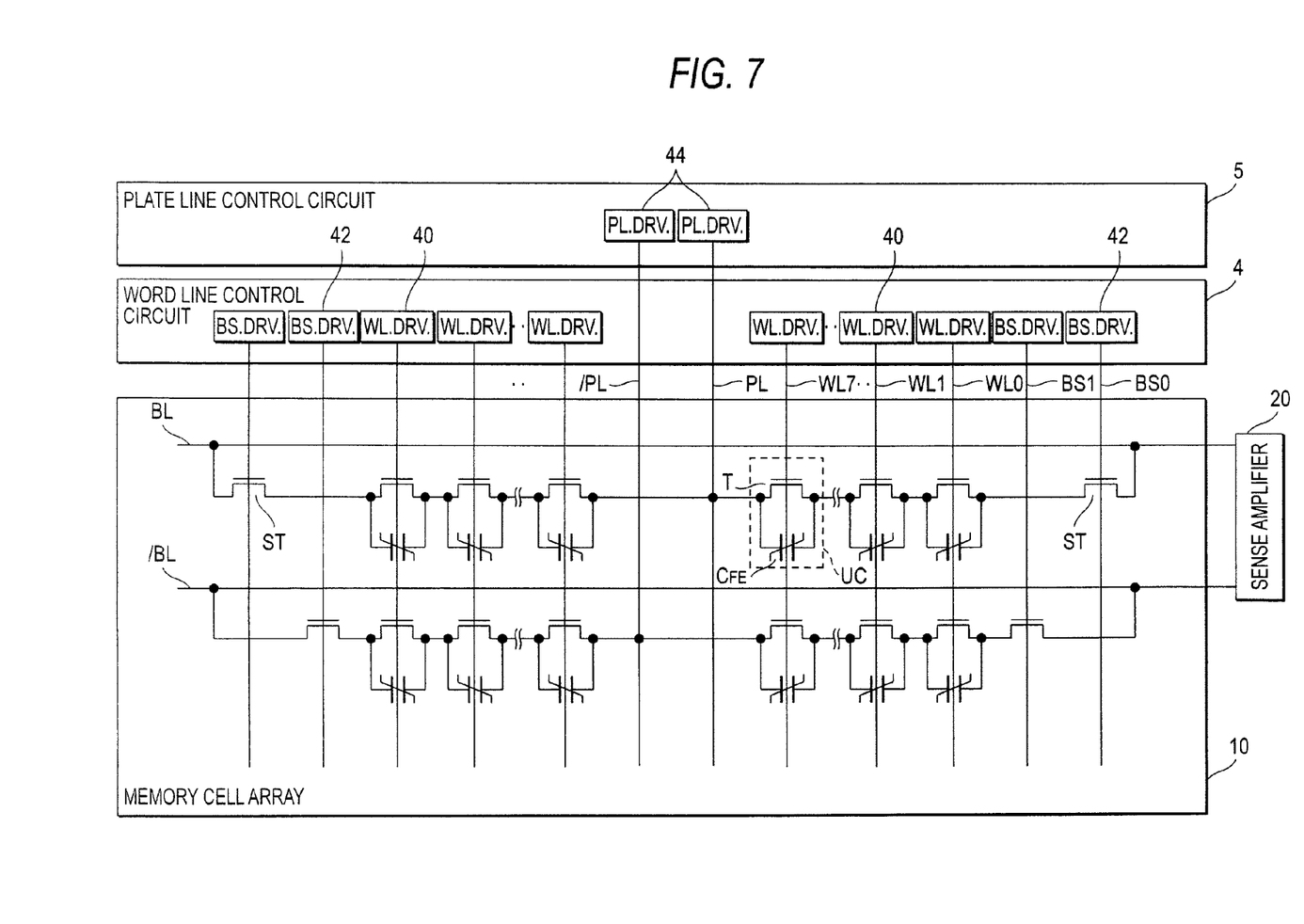
FIG. 7 is a circuit diagram of an example (series connected TC unit type FeRAM cell array) of a memory array according to the embodiment of the invention.

According to the embodiment of the invention, as the memory cell array 10, there can be applied, for example, such a "series connected TC unit type FeRAM" as shown in FIG. 7.

The unit cell UC of the series connected TC unit type FeRAM includes a ferroelectric capacitor CFE and a cell transistor T, the two ends of a ferroelectric capacitor CFE is connected to the source and the drain of a cell transistor T respectively. That is, the memory cell 10 includes word lines WL (WL0-WL7) and plate lines PL (PL, /PL) respectively extending in the longitudinal direction, and bit lines BL (BL, /BL) respectively extending in the transverse direction. The unit cell UC includes a transistor T having a drain connected to the bit lines BL (BL, /BL), a source connected to the plate lines PL (PL, /PL), and a gate connected to the bit lines BL (BL, /BL) and the word lines WL (WL0-WL7), and the ferroelectric capacitor CFE connected in parallel between the source and drain of the transistor T. The unit cells UC are respectively disposed in the crossing portions of the word lines WL (WL0-WL7) and bit lines BL (BL, /BL) The unit sells UC are arranged in series between the plate lines PL (PL, /PL) and bit lines BL (BL, /BL). The blocks of the series connected TC unit type FeRAMs connected in series in a string manner can be selected by a block select transistor ST. The gates of the respective cell transistors T are connected to the word lines WL (WL0-WL7), and the gates of the block select transistors ST are connected to block select lines BS (BS0, BS1).

The word lines WL (WL0-WL7) are respectively connected to word line drivers (WL. DRV.) 40 which are disposed within the word line control circuit 4, while the block select lines BS (BS0, BS1) are respectively connected to block select line drivers (BL. DRV.) 42 which are disposed within the word line control circuit 4. The plate lines (PL, /PL) are respectively connected to plate line drivers (PL. DRV.) 44 disposed within the plate line control circuit 5.

The memory cell array 10 has a structure that the blocks of the series connected TC unit type FeRAMs are arranged parallel in the direction where the word line WL (WL0-WL7) extend. Also, the memory cell array 10 has a structure that the blocks of the series connected TC unit type FeRAMs are turned back in the extending direction of the bit lines BL (BL, /BL) with the plate lines PL (PL, /PL) as the centers thereof.

Figure 8:
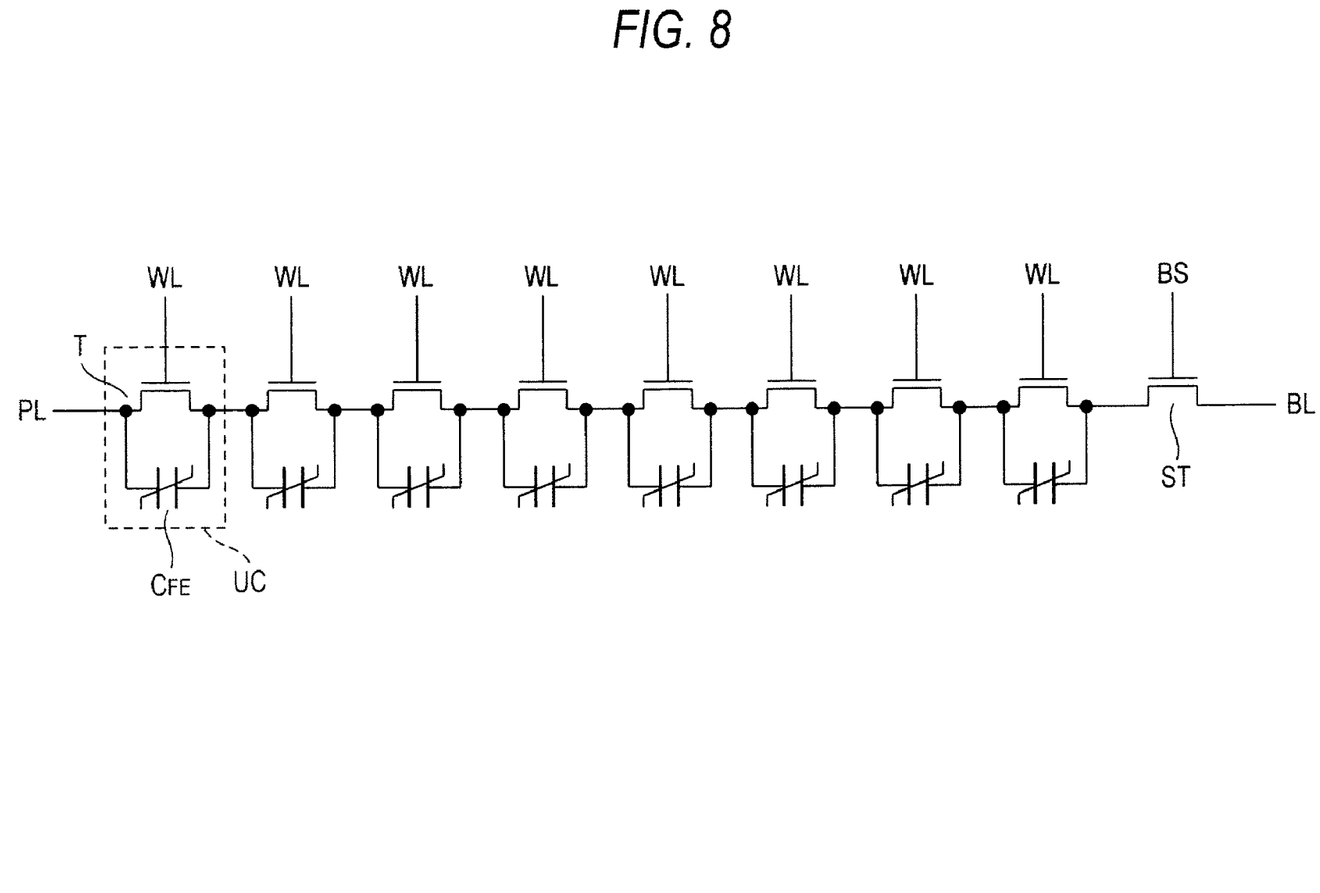
FIG. 8 is a circuit diagram of an example of a cell block according to the embodiment of the invention.

As shown in FIG. 8, in the series connected TC unit type FeRAM, the potential of the word line WL (WL0-WL7) and the potential of the block select line BS (BS0, BS1) may take either the internal power supply VPP or the ground potential VSS. Especially, in a standby state, the WL potential provides the internal power supply VPP, while the BS potential provides 0V. The potential of the plate lines PL (PL, /PL) may take either the internal power supply VAA or the ground potential VSS. In the standby state, the PL potential provides 0V, whereas, to the plate lines PL (PL, /PL) selected in the active state, there is applied the internal power supply VAA. To the bit lines BL (BL, /BL), there is connected the sense amplifier 20 and, in the standby state, the potential of bit the lines BL (BL, /BL) is equalized to 0V.

Figure 9:
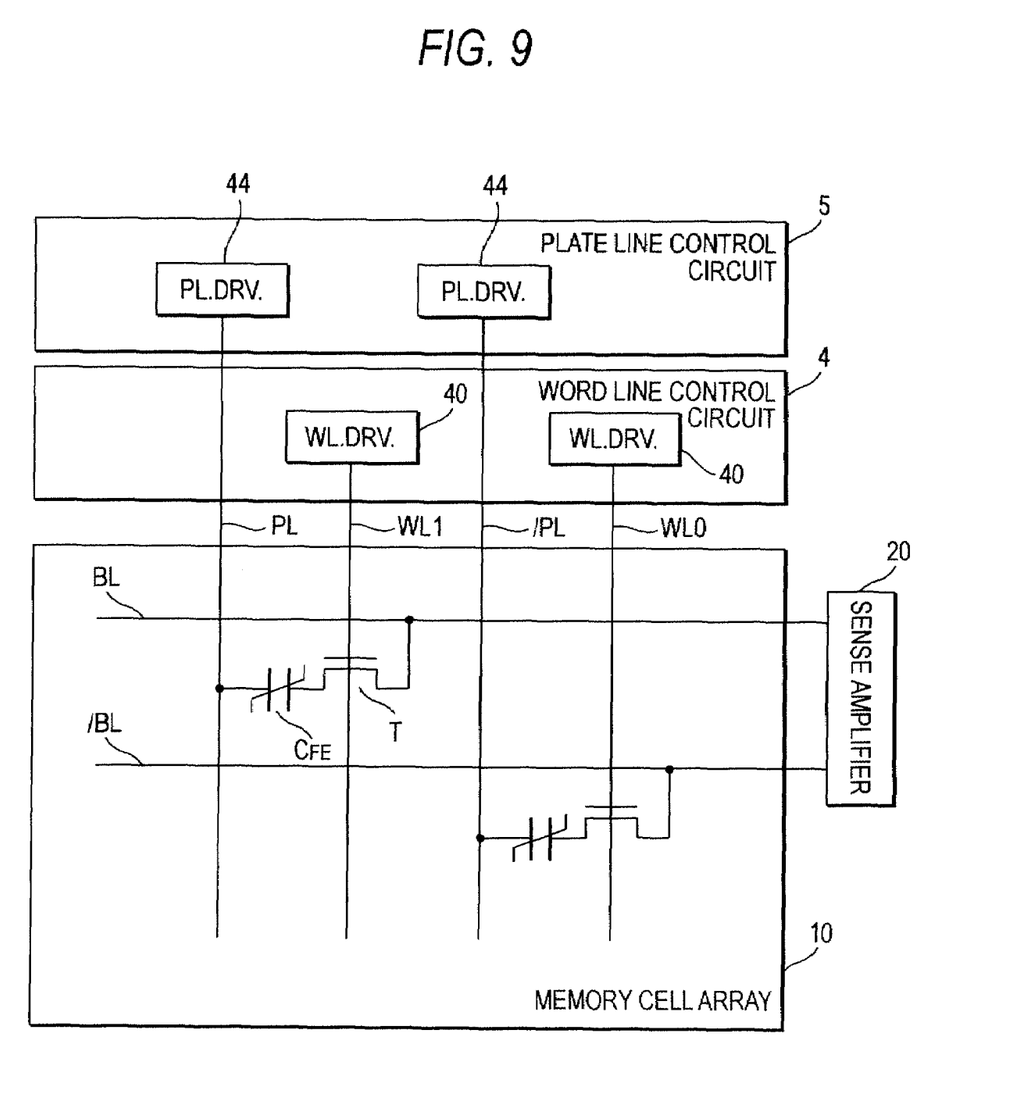
FIG. 9 is a circuit diagram of another example (DRAM type FeRAM cell array) of a memory cell array according to the embodiment of the invention.

According to the embodiment of the invention, as the memory cell array 10, there can also be applied such a "DRAM type FeRAM" as shown in FIG. 9. The unit cell UC of the DRAM type FeRAM includes a cell transistor T and a ferroelectric capacitor CFE connected in series to the source of the cell transistor T. Such unit cells UC are respectively arranged in the crossing portions of plate lines PL (PL, /PL) and bit lines BL (BL, /BL), thereby forming a matrix. The gates of the respective cell transistors T are respectively connected to the word lines WL, the other electrodes of the ferroelectric capacitors CFE opposite to the electrodes thereof connected to the sources of the cell transistors T are respectively connected to their associated plate lines PL (PL, /PL), and the drains of the cell transistors T are respectively connected to the bit lines BL (BL, /BL).

Word lines WL (WL0, WL1, . . . ) are respectively connected to their associated word line drivers (WL. DRV.) 40 which are disposed within the word line control circuit 4, whereas the plate lines PL (PL, /PL) are respectively connected to plate line drivers (PL. DRV.) 44 which are arranged within the plate line control circuit 5.

In the DRAM type FeRAM, the potential of the word lines WL maintain 0V in the standby state, and the internal power supply VPP is applied to only the word line WL that is selected in the active time. As regards the potential of the plate lines PL (PL, /PL), in the active time, there is applied the internal power supply VAA and, in the standby time, there is applied the ground potential VSS. The bit lines BL (BL, /BL) is connected to the sense amplifier 20, and electric charges read from the ferroelectric memory cells are to be transferred to the bit lines BL. In the standby state, the potential of the bit lines BL (BL, /BL) is equalized to GND.

Next, a start order control method when a ferroelectric memory is turned on and a discharge order control method when the ferroelectric memory is turned off will be described with reference to a timing chart shown in FIG. 2.

(a): At time T1, when turning on the ferroelectric memory, the external power supply VDD is started. On detecting that the external power supply VDD has risen up to a given potential, a power supply potential detection signal MINVDD is activated by the power supply potential detection circuit 1 (time T2).

(b): At time T3, the VPP power supply circuit 2 activates the internal power supply VPP which is to be supplied to the word lines, word line control circuit 4 and the like, in response to a VPP start signal from the power supply potential detection circuit 1. At time T4, the VINT power supply circuit 3 activates the internal power supply VINT to be supplied to the peripheral circuits, in response to a VINT start signal from the start order control circuit 7. At time T5, the VAA power supply circuit 13, activates the internal power supply VAA to be supplied to the core circuit, in response to a VAA start signal from the start order control circuit 7. Here, since the FeRAM is nonvolatile and has destructive reading, it is necessary to prevent a malfunction from occurring in the core circuits and thus to prevent the writing of wrong data. For this purpose, after the internal power supply VINT is activated and the peripheral circuits are held in normal operation, the internal power supply VAA is activated and then supplied to the core circuits.

(c): After given writing and reading are enforced, at time T6, the reset signal generation circuit 12 activates a reset signal POR, in response to a reset control signal from the power supply potential detection circuit 1. The reset signal POR resets and deactivate the peripheral circuits and core circuits.

(d): Here, the ferroelectric memory is turned off at time T7 in this example. When turning off the ferroelectric memory, the external power supply VDD is cut off. When the external power supply VDD has lowered down to a given potential, a power supply potential detection signal MINVDD output from the power supply potential detection circuit 1 is deactivated at time T8.

(e): When the ferroelectric memory is turned off, the respective signals are deactivated in the reversed order to their activated order. That is, at time T8, at the same time when the power supply potential detection signal MINVDD is deactivated, the reset signal POR is deactivated. It takes a given period of time for the reset signal POR to reach the whole chip. Therefore, after the elapse of a delay time necessary for the reset signal POR to reach the whole chip, the internal power supply VAA is deactivated, whereby the voltage of the internal power supply VAA to be supplied to the memory cell array is lowered down to 0 [V]. Accordingly, the array voltage can be put to 0 [V] after the operation of the whole chip is positively stopped. Finally, the internal power supply VINT to be supplied to the peripheral circuits for controlling the array is deactivated. Here, it should be specially noted that, when the internal power supply VINT of the peripheral circuits has been deactivated before the internal power supply VAA to be supplied to the core circuits is deactivated, a malfunction may occur in the core circuits to select a ferroelectric cell, and thus wrong data may be written. That is, a malfunction may occur in the ferroelectric memory.

(f): The VAA delay circuit 110 of the discharge order control circuit 8 delays the activation of the VAA discharge signal is delayed. In this case, the pool circuit 100 is used to prevent the malfunction of the VAA delay circuit 110, even when the external power supply VDD is deactivated suddenly. After the reset signal POR reaches the whole chip, at time T9, the VAA discharge signal is activated, while the internal power supply VAA of the VAA power supply circuit 13 is deactivated.

(g): The VINT delay circuit 120 of the discharge order control circuit 8 delays the activation of the VINT discharge signal. The pool circuit 100 is used to prevent the malfunction of the VINT delay circuit 120 can be prevented, even when the external power supply VDD is deactivated suddenly. After the internal power supply VAA is deactivated, at time T10, the VINT discharge signal is activated, while the internal power supply VINT is deactivated. On receiving the VINT discharge signal, the VINT power supply circuit 3 is deactivated and the internal power supply VINT is shorted to the ground potential VSS. As has been described heretofore, since it is necessary that the internal power supply VINT is deactivated after the internal power supply VAA is deactivated, in order to shorten as much as possible the time necessary for completion of the turn-off operation of the ferroelectric memory, the time necessary for deactivation of the internal power supply VAA may be preferably short as much as possible. For this reason, as shown in FIG. 1, the signal HVAAVSS is generated by a logic circuit such as the AND gate 11 to prevent the signal HVAAVSS from becoming obtuse. In this case, a shoot-through current may flows the inverter INV12, the RC delay of the inverter INV10 is small and the size of the shoot-through current can be neglected. On the other hand, as shown in FIG. 1, the signal HVINTVSS is generated by an RC delay circuit such as the inverter INV20. Since the VINT discharge signal is forcedly discharged finally, the necessity for shortening the time of deactivation of the VINT discharge signal is small compared with the internal power supply VAA. That is, even when the signal HVINTVSS having an obtuse waveform is input directly to the gate of the transistor Q23 and the VINT discharge signal is drawn out slowly, there can arise no problem. During this operation, the internal power supply VPP of the VPP power supply circuit 2 for driving the word lines WL is not discharged forcedly and the operation of a circuit for boosting the word lines WL is deactivated; however, since the word lines WL themselves have a large capacity, the potential of the word lines WL are discharged naturally and are thereby allowed to lower down slowly.

(h): At time T11, at the time when the internal power supply VINT is discharged down to the ground potential VSS, there are not left electric charges which drive the plate lines PL and bit lines BL. That is, while the potential of the word lines WL of the memory cell are sufficiently high and both electrodes of the memory cell capacitor CFE are in conduction, the internal power supply VAA for driving the plate lines PL and bit lines BL as well as the internal power supply VINT of the peripheral circuits are controlled to be deactivated. Therefore, no voltage is applied to the both ends of the memory cell capacitor CFE to thereby be able to prevent data against destruction.

As has been described heretofore, according to the embodiment of the invention, the discharge order control circuit 8 restricts the consumption of electric charges stored in the pool circuit 100 by the external power supply VDD restricted. As a result, the internal power supplies VAA and VINT can be positively discharged sequentially, thereby being able to turn off the FeRAM without causing a malfunction and also without enlarging the size of capacitor C10 in the pool circuit 100, which makes it possible to read and write data in the FeRAM without destructing the data.

First Modification

Figure 10:
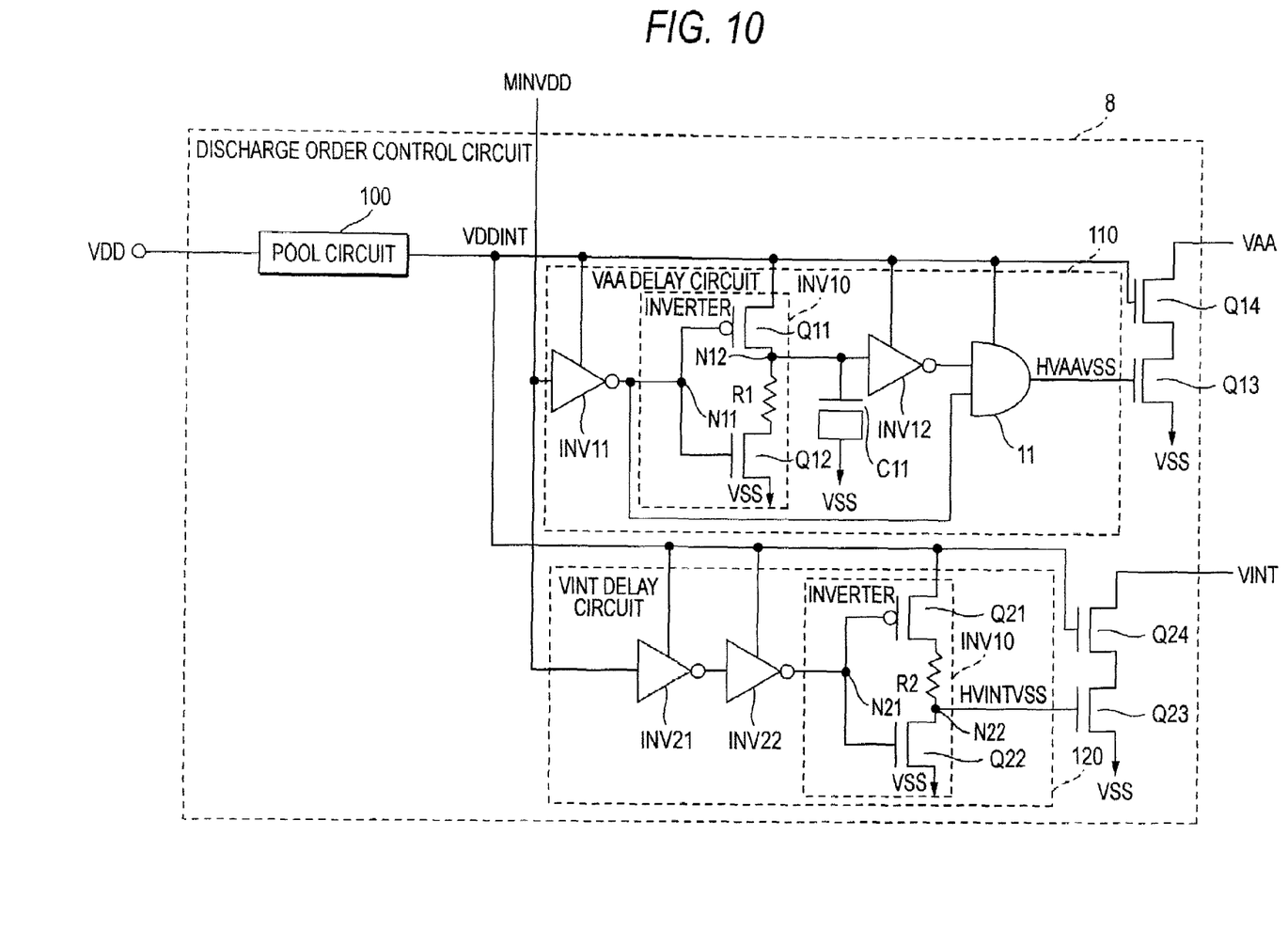
FIG. 10 is a circuit diagram of an example of a discharge order control circuit according to a first modification of the embodiment of the invention.

In a discharge order control circuit 8 according to a first modification of the embodiment of the invention, as shown in FIG. 10, a plurality of (two-stage, this example) discharge transistors Q13, Q14 are connected to the VAA delay circuit 110, and a plurality of (two-stage, this example) discharge transistors Q23, Q24 are connected to the VINT delay circuit 120.

The discharge transistor Q14 has a gate connected to the potential VDDINT, a drain connected to the VAA power supply circuit 13, and a source connected to the drain of the discharge transistor Q13.

Since the gate of the discharge transistor Q23 receives an input having obtuse waveforms from the previous stage, i.e., the VINT delay circuit 120, a drain current may generate a substrate current to thereby reduce the reliability of the discharge transistor Q23. Also, although the obtuse waveform is not input to the gate of the discharge transistor Q13, depending on the voltage VAA, a drain current may generate a substrate current that adversely affects the reliability of the transistor Q13. According to the first modification of the embodiment of the invention, since the discharge transistors Q13, Q14 and discharge transistors Q23, Q24 are respectively arranged in two stages, the electric field is relaxed to thereby be able to restrict the generation of the substrate current.

Figure 11:
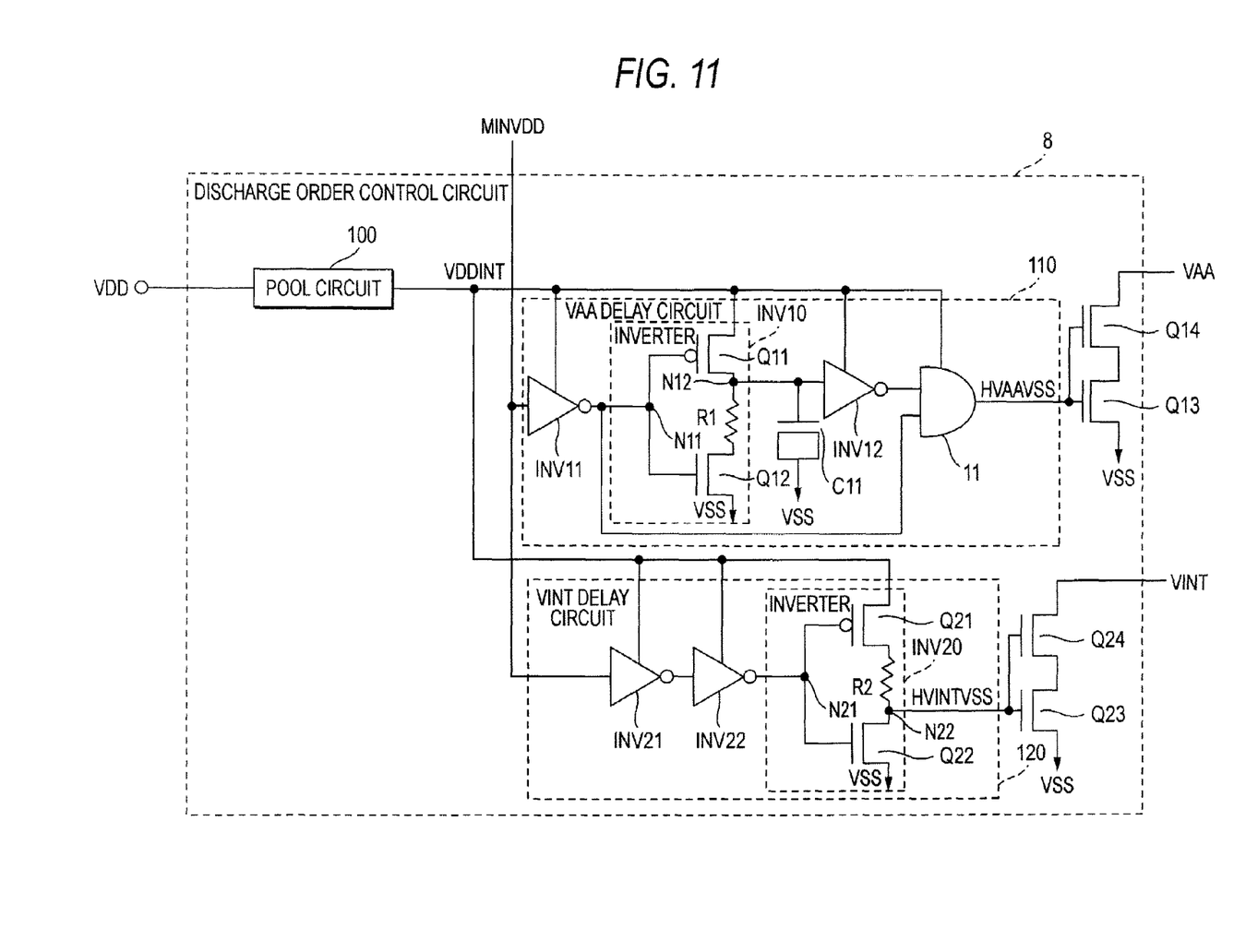
FIG. 11 is a circuit diagram of another example of the discharge order control circuit according to the first modification of the embodiment of the invention.

As shown in FIG. 11, a signal HVAAVSS output from the VAA delay circuit 110 and a signal HVINTVSS output from the VINT delay circuit 120 may be input to the gates of the discharge transistors Q14, Q24, respectively.

Second Modification

Figure 12:
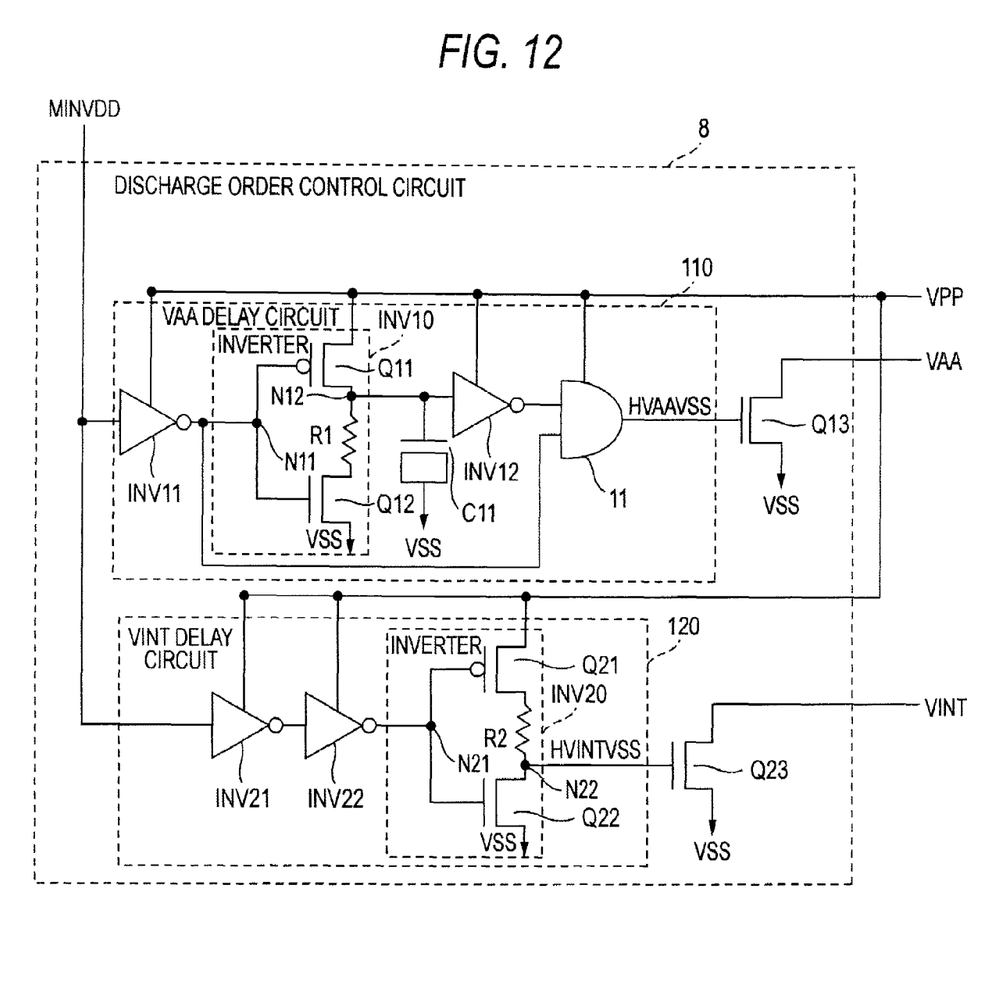
FIG. 12 is a circuit diagram of an example of a discharge order control circuit according to a second modification of the embodiment of the invention.

In a discharge order control circuit 8 according to a second modification of the embodiment of the invention, as shown in FIG. 12, the external power supply VDD is lowered in potential down to the threshold value to thereby store the electric charges in the pool circuit 100. Thus, instead of a method for using the potential VDDINT based on the stored electric charge, there is used the internal power supply VPP based on the electric charges stored in the word lines WL.

Specifically, the internal power supply VPP based on the electric charges stored in the word lines WL is used to activate the inverters INV11, INV10, INV12 and the AND gate 11 in the VAA delay circuit 110, thereby delaying a VAA discharge signal. The internal power supply VPP is used to activate the inverters INV21, INV22 and INV20 in the VINT delay circuit 120, thereby delaying a VINT discharge signal.

In the "series connected TC unit type FeRAM," during a standby state, all of the word lines WL are activated to thereby allow conduction between the two electrodes of a ferroelectric capacitor. As shown in FIG. 2, when turning off the "series connected TC unit type FeRAM," of the internal power supplies VAA, VINT and VPP, the internal power supply VPP is deactivated latest. That is, in the power off time, the VPP potential is stored in the word lines WL that are largest in capacity and the electric charges of the VPP potential are used to generate a power off control signal.

According to the discharge order control circuit 8 shown in FIG. 12, since the internal power supply VPP based on the electric charges stored in the word lines WL is used, even when a shoot-through current flows in the inverter INV10 in the VAA delay circuit 110, the electric charges of the internal power supply VPP stored in the word lines WL cannot be used up easily. Therefore, it is possible to prevent the occurrence of a malfunction in the VAA delay circuit 110 and VINT delay circuit 120.

Other Embodiments

Although the present invention has been described heretofore with reference to the embodiment thereof, it is to be understood that the present invention is not limited to the above description and the drawings as a part of the disclosure. It is obvious from the present disclosure to persons skilled in the art that other various embodiments, the other examples and the other operating technologies are possible.

It goes without saying that the invention includes other various embodiments and modifications which have not been described in this specification.

It is to be understood that the present invention is not limited to the specific embodiment described above and that the invention can be embodied with the elements modified without departing from the spirit and scope of the invention. The present invention can be embodied in various forms according to appropriate combinations of the elements disclosed in the embodiment described above. For example, some elements may be deleted from all elements shown in the embodiment. Further, the elements in different embodiments may be used appropriately in combination.

What is claimed is:

1. A discharge order control circuit for controlling a discharge order of a plurality of internal power supplies each of which power is generated based on power supplied from an external power supply, the discharge order control circuit comprising:

a pool circuit that stores electric charges provided from a potential of the external power supply;

a first delay circuit that operates on the electric charges stored in the pool circuit and delays a discharge signal generated when potential of the external power supply is lowered to a predetermined potential level, the first delay circuit including a first inverter array having a plurality of stages each containing an inverter, the plurality of stages including a final stage that outputs the delayed discharge signal, and only the inverter of the final stage which generates an RC delay; and a first discharge unit that discharges a first internal power supply included in the plurality of internal power supplies in response to the delayed discharge signal output from the inverter of the final stage of the first inverter array.

2. The circuit according to claim 1, further comprising:

a second delay circuit that operates on the electric charges stored in the pool circuit and delays the discharge signal, the second delay circuit including a second inverter array having a plurality of stages each containing an inverter, and only the inverter of a middle stage which generates an RC delay; and a second discharge unit that discharges a second internal power supply different from the first internal power supply in response to the delayed discharge signal output from the second delay circuit.

3. The circuit according to claim 2, wherein a delay time of the first delay circuit is longer than a delay time of the second delay circuit.

4. The circuit according to claim 1, wherein:

the inverter of the final stage of the first inverter array includes a pMOS transistor and an nMOS transistor each having a gate connected to an output of an inverter of a previous stage, and a resistor connected between a drain of the pMOS transistor and a drain of the nMOS transistor; and an input of the first discharge unit is connected between the resistor and the drain of the nMOS transistor.

5. The circuit according to claim 1, wherein the first discharge unit comprises a first discharge transistor including a gate directly connected to an output node of the inverter of the final stage of the first inverter array, a drain connected to the first internal power supply, and a source connected to a ground potential.

6. The circuit according to claim 5, wherein the first discharge unit further comprises a transistor inserted between the drain of the first discharge transistor and the first internal power supply.

7. The circuit according to claim 6, wherein the transistor includes a gate connected to the pool circuit, a drain connected to the first internal power supply, and a source connected to the drain of the first discharge transistor.

8. The circuit according to claim 6, wherein the transistor includes a gate connected to the output node of the inverter of the final stage of the first inverter array, a drain connected to the first internal power supply, and a source connected to the drain of the first discharge transistor.

9. The circuit according to claim 1, wherein the electric charges stored in the pool circuit is provided for all the inverters of the first inverter array.

10. A discharge order control circuit for use in a memory device including a memory cell and for controlling the discharge order of a plurality of internal power supplies each of which power is generated based on power supplied from an external power supply, the discharge order control circuit comprising:

a first delay circuit that operates on the electric charges stored in a word line disposed in the memory cell and delays a discharge signal generated when the external power supply potential is lowered to a predetermined potential level, the first delay circuit including a first inverter array having a plurality of stages each containing an inverter, the plurality of stages including a final stage that outputs the delayed discharge signal, and only the inverter of the final stage which generates an RC delay; and a first discharge unit that discharges a first internal power supply included in the plurality of internal power supplies in response to the delayed discharge signal output from the inverter of the final stage of the first inverter array.

11. The circuit according to claim 10, further comprising:

a second delay circuit that operates on the electric charges stored in the word line and delays the discharge signal, the second delay circuit including a second inverter array having a plurality of stages each containing an inverter, and only the inverter of a middle stage which generates an RC delay; and a second discharge unit that discharges a second internal power supply different from the first internal power supply in response to the delayed discharge signal output from the second delay circuit.

12. The circuit according to claim 11 wherein a delay time of the first delay circuit is longer than a delay time of the second delay circuit.

13. The circuit according to claim 10, wherein:

the inverter of the final stage of the first inverter array includes a pMOS transistor and an nMOS transistor each having a gate connected to an output of an inverter of a previous stage, and a resistor connected between a drain of the pMOS transistor and a drain of the nMOS transistor; and an input of the first discharge unit is connected between the resistor and the drain of the nMOS transistor.

14. The circuit according to claim 10, wherein the first discharge unit comprises a first discharge transistor including a gate directly connected to an output node of the inverter of the final stage of the first inverter array, a drain connected to the first internal power supply, and a source connected to a ground potential.

15. The circuit according to claim 10, wherein the electric charges stored in the word line is provided for all the inverters of the first inverter array.

16. A memory device comprising:

a power supply potential detection circuit that monitors potential of an external power supply and generates a discharge signal when potential of the external power supply is lowered to a predetermined potential level;

a memory cell array;

a first internal power supply that supplies power to the memory cell array;

a second internal power supply that supplies power to a peripheral circuit that controls an operation of the memory cell array; and a discharge order control circuit that controls a discharge order of the first internal power supply and the second internal power supply, wherein the discharge order control circuit includes:

a pool circuit that stores electric charges provided from a potential of the external power supply;

a first delay circuit that operates on the electric charges stored in the pool circuit and delays the discharge signal output from the power supply potential detection circuit, the first delay circuit including a first inverter array having a plurality of stages each containing an inverter, the plurality of stages including a final stage that outputs the delayed discharge signal, and only the inverter of the final stage which generates an RC delay; and a first discharge unit that discharges the first internal power supply in response to the delayed discharge signal output from the inverter of the final stage of the first inverter array.

17. The device according to claim 16, wherein the discharge order control circuit further includes:
a second delay circuit that operates on the electric charges stored in the pool circuit and delays the discharge signal, the second delay circuit including a second inverter array having a plurality of stages each containing an inverter, and only the inverter of a middle stage which generates an RC delay; and a second discharge unit that discharges the second internal power supply in response to the delayed discharge signal output from the second delay circuit.

18. The device according to claim 17, wherein a delay time of the first delay circuit is longer than a delay time of the second delay circuit.

19. The device according to claim 16, wherein the memory cell array includes a plurality of unit cells each containing a transistor and a ferroelectric capacitor.

* * * * *